(12) United States Patent
Zhou et al.

(10) Patent No.: US 10,770,521 B2
(45) Date of Patent: Sep. 8, 2020

(54) DISPLAY PANEL, DISPLAY AND DISPLAYING METHOD

(71) Applicant: BOE TECHNOLOGY GROUP CO., LTD., Beijing (CN)

(72) Inventors: Tingting Zhou, Beijing (CN); Bin Zhang, Beijing (CN); Jikai Yao, Beijing (CN); Yang Yang, Beijing (CN)

(73) Assignee: BOE TECHMOLOGY GROUP CO., LTD., Beijing (CN)

( * ) Notice: Subject to any disclaimer, the term of this patent is extended or adjusted under 35 U.S.C. 154(b) by 110 days.

(21) Appl. No.: 15/940,023

(22) Filed: Mar. 29, 2018

(65) Prior Publication Data
US 2019/0131361 A1 May 2, 2019

(30) Foreign Application Priority Data
Oct. 27, 2017 (CN) .......................... 2017 1 1021870

(51) Int. Cl.
*G02F 1/1335* (2006.01)
*H01L 27/32* (2006.01)
(Continued)

(52) U.S. Cl.
CPC .......... *H01L 27/3232* (2013.01); *G02B 30/27* (2020.01); *G02F 1/13439* (2013.01); *G02F 1/133504* (2013.01); *G02F 1/133512* (2013.01); *G02F 1/133555* (2013.01); *G02F 1/133603* (2013.01); *G02F 1/133621* (2013.01); *H01L 27/322* (2013.01); *H01L 51/5271* (2013.01); *G02F 1/133514* (2013.01); *G02F 1/133528* (2013.01); *G02F 1/136227* (2013.01); *G02F 2001/133567* (2013.01); *G02F 2001/133614* (2013.01); *G02F 2001/133616* (2013.01); *G02F 2001/133626* (2013.01);
(Continued)

(58) Field of Classification Search
CPC ... G02F 1/133555; G02F 2001/133626; G02F 2201/44; H01L 27/3232
See application file for complete search history.

(56) References Cited

U.S. PATENT DOCUMENTS

| 9,983,439 B2 | 5/2018 | Mizunuma et al. |
| 10,153,460 B2* | 12/2018 | Isaka ..................... G09G 3/3225 |
| 2017/0003548 A1* | 1/2017 | Mizunuma ........ G02F 1/133617 |

FOREIGN PATENT DOCUMENTS

| CN | 101464590 A | 6/2009 |
| CN | 202330954 | 7/2012 |

(Continued)

OTHER PUBLICATIONS

First Chinese Office Action dated Jan. 3, 2020, received for corresponding Chinese Application No. 201711021870.7, 15 pages.

*Primary Examiner* — Paisley L Wilson
(74) *Attorney, Agent, or Firm* — Kinney & Lange, P.A.

(57) ABSTRACT

Embodiments of the present disclosure provide a display panel, a display and a displaying method. The display panel includes: a first base substrate and a second base substrate arranged to be opposite to each other; a liquid crystal layer between the first base substrate and the second base substrate; and a light emitting device layer for emitting light, a grating layer of partial light transmission and a light converting layer arranged at a side of the second base substrate facing towards the first base substrate.

14 Claims, 3 Drawing Sheets

(51) Int. Cl.
    *G02F 1/1343*        (2006.01)
    *G02F 1/13357*     (2006.01)
    *H01L 51/52*         (2006.01)
    *G02B 30/27*        (2020.01)
    *G02F 1/1362*       (2006.01)
    *H01L 51/00*         (2006.01)

(52) U.S. Cl.
    CPC ...... *G02F 2201/44* (2013.01); *G02F 2202/36* (2013.01); *H01L 27/3211* (2013.01); *H01L 51/0024* (2013.01); *H01L 51/5253* (2013.01); *H01L 51/5281* (2013.01)

(56) References Cited

FOREIGN PATENT DOCUMENTS

| | | |
|---|---|---|
| CN | 106324890 A | 1/2017 |
| CN | 106842731 A | 6/2017 |

\* cited by examiner

DISPLAY PANEL, DISPLAY AND DISPLAYING METHOD

CROSS-REFERENCE TO RELATED APPLICATION

This application claims the priority benefit of Chinese Patent Application No. 201711021870.7 titled "DISPLAY PANEL, DISPLAY DEVICE AND DISPLAYING METHOD" filed on Oct. 27, 2017 in the State Intellectual Property Office of China, the whole disclosure of which is incorporated herein by reference.

BACKGROUND

The present disclosure relates generally to the technical field of displays, and particularly more particularly to displays, display panels, and a displaying method.

With the development of a stereoscopic display technology, three dimensional video programs are becoming more and more widely used. Currently, one trend of the display technology field to the design of display devices that can support both two-dimension and stereoscopic display.

SUMMARY

The present disclosure is directed at least in part towards a display device that may support both a two-dimension display and a three-dimension or stereoscopic display. In order to achieve the target, there is provided a display panel, a display and a displaying method.

As an aspect, there is provided a display panel including a first base substrate and a second base substrate arranged to be opposite to each other, a liquid crystal layer configured between the first base substrate and the second base substrate, a light emitting device layer arranged at a side of the second base substrate facing towards the first base substrate, and a grating layer arranged between the light emitting device and the liquid crystal layer. The grating layer comprises a plurality of light blocking portions and a plurality of light transmitting portions alternately arranged therein, the light blocking portions being capable of reflecting light.

In at least one embodiment disclosed herein, the grating layer is made of metal. According to an embodiment of the present disclosure, the display panel further includes a light converting layer provided on each of the light blocking portions, wherein the light emitting device layer, the grating layer and the light converting layers are arranged in order in a direction from the first base substrate to the second base substrate.

According to an embodiment of the present disclosure, the light emitting device layer further includes a drive circuit.

According to an embodiment of the present disclosure, each of the light blocking portions comprises a plurality of sub light blocking portions, configured to be spaced from each other, each electrically connecting the drive circuit via a through hole that passes through the light emitting device layer.

According to an embodiment of the present disclosure, the light converting layer comprises a plurality of light converting units and an orthographic projection of each light converting unit on the first base substrate is of superposition with an orthographic projection of the corresponding sub light blocking portions on the first base substrate.

According to an embodiment of the present disclosure, the light converting layer comprises a plurality of light converting units and an orthographic projection of each light converting unit on the first base substrate is within an orthographic projection of the corresponding sub light blocking portions on the first base substrate.

According to an embodiment of the present disclosure, a first electrode layer is provided on a surface of the second base substrate facing towards the first base substrate, the electrode layer being located between the second base substrate and the liquid crystal layer; and a first insulating layer is provided at a surface of the first base substrate facing towards the second base substrate, the first insulating layer isolating the liquid crystal layer from the light converting layer and the grating layer on the first base substrate.

According to an embodiment of the present disclosure, a second insulating layer and a second electrode layer are disposed between the grating layer and the light converting layer, the second electrode layer comprising a plurality of second sub electrodes, an orthographic projection of the light converting unit on the first base substrate being of superposition with an orthographic projection of the second sub electrode on the first base substrate.

According to an embodiment of the present disclosure, each of the second sub electrodes is electrically connected with the drive circuit via a through hole passing through the second insulating layer and the light emitting device layer.

According to an embodiment of the present disclosure, the second electrode layer is made of transparent conductive material.

According to an embodiment of the present disclosure, the light converting layer is a quantum dot containing film.

According to an embodiment of the present disclosure, the light emitting device layer comprises a plurality of light emitting devices arranged in an array.

According to an embodiment of the present disclosure, the display panel further includes a polarizing sheet located at a side of the second base substrate facing away from the liquid crystal layer.

As a second aspect, there is provided a display including the display panel provided by the embodiments of the present disclosure.

a. As a third aspect, there is provided a displaying method of the display panel, the displaying method including: performing a first display mode and performing a second display mode; wherein the first display mode includes the steps of controlling the light emitting device layer to emit no light and driving deflection of liquid crystal molecules in the liquid crystal layer, and the second display mode comprises the steps of controlling the light emitting device layer to emit light and driving deflection of liquid crystal molecules in the liquid crystal layer.

According to an embodiment of the present disclosure, under the second display mode, the driving deflection of liquid crystal molecules in the liquid crystal layer comprises: driving the drive circuit to control a region of the light transmitting portion corresponding to the liquid crystal layer to transmit light.

The present summary is provided only by way of example, and not limitation. Other aspects of the present disclosure will be appreciated in view of the entirety of the present disclosure, including the entire text, claims, and accompanying figures.

Figure 1:
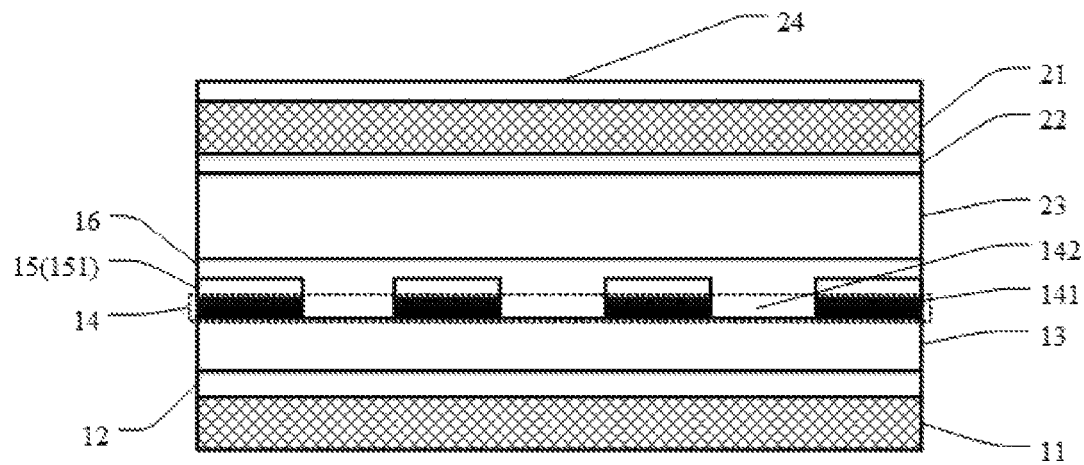
FIG. 1 illustrates a cross sectional view of an exemplary structure of a display panel according to an embodiment of the present disclosure.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION OF THE EMBODIMENTS

The present disclosure will be further described in detail by combination with the drawings and embodiments. It is understood that the embodiments described herein are merely to interpret the related disclosure, but not to limit the present disclosure. Furthermore, the drawings merely illustrate some embodiments of the present disclosure for ease of description.

It is noted that, without conflict, embodiments and features of the embodiments of the present disclosure may be combined. The present disclosure will be described in detail by reference to the drawings and in conjunction with the embodiments.

Referring to FIG. 1, embodiments of the present disclosure provide a display panel including a first base substrate 11 and a second base substrate 21 arranged to be opposite to each other, a liquid crystal layer 23 configured between the first base substrate 11 and the second base substrate 21, and a light emitting device layer 12 arranged at a side of the second base substrate 11 facing towards the first base substrate 21 and capable of emitting light. FIG. 1 further illustrates a grating layer 14, which is capable of partial light transmission and is arranged between the light emitting device and the liquid crystal layer.

In at least one embodiment, the grating layer 14 includes a plurality of light blocking portions 141 (or a light non-transmitting portion) and a plurality of light transmitting portions 142 that are arranged in an alternating pattern. When external light is incident to the display panel, it passes through the liquid crystal layer and is reflected by the light blocking portions 141 to enter the liquid crystal layer again so as to achieve a two-dimension display. The light transmitting portions 142 are capable of transmitting light therethrough from the light emitting device layer 12 to the liquid crystal layer 23 so as to create a three-dimension display. In an embodiment, a color filter layer may be provided on the light blocking portions so as to achieve a color two-dimension display.

In at least one embodiment, the second base substrate 21 includes a first electrode layer 22 configured on a surface of the second base substrate 21 facing towards the first base substrate 11 and located between the second base substrate 21 and the liquid crystal layer 23. In this embodiment, the liquid crystal layer 23 in the display panel is used to create a two-dimension display while the light emitting device layer 12 cooperating with the grating layer 14 may perform a three dimension display. In this way, the display panel can provide two different display modes.

The first base substrate 11 and the second base substrate 21 can be made of materials including any of polyimide, plastic, silicon and glass. In some embodiments, the grating layer 14 includes a plurality of light blocking portions 141 and a plurality of light transmitting portions 142 alternately arranged. In some embodiments, the light blocking portions 141 may be reflective. In some embodiments, the light blocking portions 141 may be made of metal. As metal has good reflective properties, in the two-dimension display mode, the reflective properties of the metal can be used such that the display panel may be considered as a reflective display panel. In some embodiments, the light blocking portions 141 may be made of other light non-transmitting material having a good reflectivity.

In some embodiments, the display panel includes a light converting layer configured for converting color of light through photoluminescence, that is, converting the light of the light source into light as required that is then used for displaying through the liquid crystal layer. In the embodiment, the light blocking portions 141 can be non-reflective and light non-transmitting material, and light emitted by the light converting layer can be used for the two-dimension display.

In at least one embodiment, the light converting layer 15 is disposed on the light blocking portions of the grating layer 14. Other component(s) can, in some embodiments, be included between the light converting layer 15 and the light blocking portions of the grating layer 14.

According to at least one embodiment of the present disclosure, an orthographic projection of the light converting layer 15 onto the grating layer 14 may not completely cover the light blocking portions of the grating layer 14. That is, the orthographic projection of the light converting layer 15 onto the grating layer 14 may be within the light blocking portions of the grating layer 14. According to an embodiment of the present disclosure, an orthographic projection of the light converting layer 15 onto the grating layer 14 may completely cover the light blocking portions of the grating layer 14.

In at least one embodiment, the display panel may further include a first insulating layer 16 arranged on the first base substrate 11 and isolating the liquid crystal layer 23 from a plurality of components on the first base substrate 11, such as from the light converting layer 15 and the grating layer 14 on the first base substrate 11.

In at least one embodiment, an insulating layer may be included between the grating layer 14 and the light emitting device layer 12. Specifically, in at least one embodiment, under the two-dimension display mode, a light source configured at a side of the second base substrate 21 facing away from the light emitting device layer 12 emits light. The light passes through the liquid crystal layer 23 and the light converting layer 15, and then is reflected by the light blocking portions 141 of the grating layer 14, and enters the light converting layer 15 again, passes through the liquid crystal layer 23 and exits the second base substrate, thereby performing two-dimension display. In this instance, the light emitting device layer 12 may not emit light. In at least one embodiment, the light converting layer 15 may not be included and the light blocking portions 141 may reflect the light from the light source to enable a two-dimension display. However, in one embodiment, the light converting layer 15 may be included and the light blocking portions thus may reflect not only a portion of the light from the light source but also the light emitted by the light converting layer, thereby achieving a two-dimension display.

In another embodiment, under the two-dimension display mode, the light source is configured at a side of the second base substrate 21 facing away from the light emitting device layer 12 and emits light. The light passes through the liquid crystal layer 23 and then irradiates the light converting layer 15 such that the light converting layer 15 emits light and the light from the light converting layer 15 passes through the liquid crystal layer 23, then exits the second base substrate, thereby forming a two-dimension display. In this instance, the light emitting device layer 12 may not emit light. It is noted that, according to embodiments of the present disclosure, the light blocking portions may have no reflective properties. However, it can be advantageous that the light converting layer 15 be capable of reflecting light from the light converting layer 15 so as to increase brightness and definition under the two-dimension display mode. As described herein, the light source can be external light, or can be a specific light source provided in the display panel or display device.

In at least one embodiment of the present disclosure, a packaging layer 13 may be further disposed between the light emitting device layer 12 and the grating layer 14, and a through hole passes through the packaging layer 13. It is understood that the through hole is disposed remotely from a region where organic luminescent material in the light emitting device layer is located, so as to eliminate negative influence on the packaging layer 13 insofar as possible.

In some embodiments, the light emitting device layer 12 may include a plurality of electroluminescence devices configured in an array so as to perform a display of color image. Specifically, the electroluminescence devices may be passive matrix organic light-emitting diodes or active matrix organic light-emitting diodes. In another embodiment, the light emitting device layer 12 may include other type of light emitting device.

In at least one embodiment, the light emitting device layer 12 can further include a drive circuit configured for driving the light emitting devices in the light emitting device layer. The drive circuit can be further configured to drive and control an electrode that is configured to deflect liquid crystal molecules in the liquid crystal layer 23, such that drive of the liquid crystal layer 23 may be achieved without adding any other functional layer into the display panel, thereby saving cost of the display panel and space in the display panel.

In at least one embodiment, the light converting layer 15 may be a nanophase containing film, such as a quantum dot containing film or a quantum line containing film. For example, the light converting layer 15 is a quantum dot containing film that may be a photoluminescent nanophase crystal containing material. The different-sized nanophase crystal containing materials may emit light at different wavelengths (i.e. with different colors), such as red light, green light and blue light. The light converting layer 15 includes a plurality of light converting units 151 and an orthographic projection of each light converting unit onto the first base substrate is located within an orthographic projection of the corresponding light blocking portion 141 onto the first base substrate. The light converting layer 15 is active only under the two-dimension display mode and works as a color filter layer/sheet. Usage of a quantum dot containing film may increase color fidelity and brightness as a whole. The light converting layer 15 can be another type of photoluminescent film and is not necessarily a nanophase crystal material.

Figure 2:
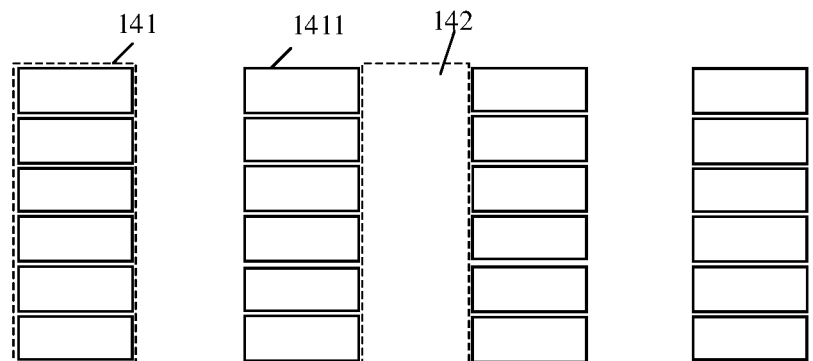
FIG. 2 illustrates an exemplary top view of a grating layer according to an embodiment of the present disclosure.

In the embodiment of FIG. 2, each of the light blocking portions 141 includes a plurality of light blocking sub-portions 1411, configured to be spaced from each other and each electrically connected with the drive circuit via a through hole that passes through the light emitting device layer 12. In embodiments wherein the light blocking portions 141 are made of metal, each light blocking sub-portion may be further used as a drive electrode of the liquid crystal layer and cooperate with the first electrode layer 22 to drive deflection of the liquid crystal molecules in the liquid crystal layer.

Figure 3:
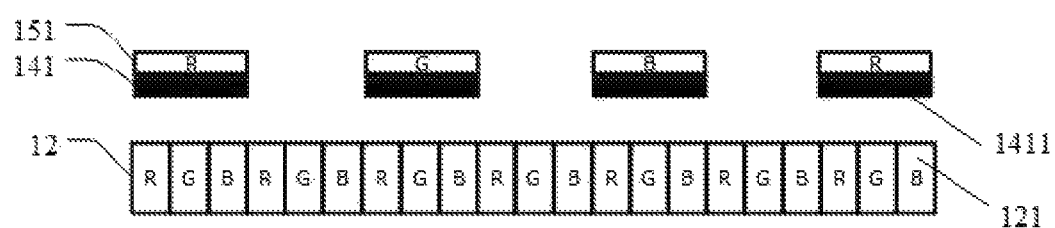
FIG. 3 illustrates a schematic view of a light converting layer, a light blocking layer and a light emitting device layer according to an embodiment of the present disclosure.

Referring to FIG. 3, a schematic view of the light converting layer 15, the grating layer 14 and the light emitting device layer 12 according to an embodiment of the present disclosure is illustrated. As shown in FIG. 3, the light converting unit 151 is correspondingly provided on top of each light blocking sub-portion 1411 and the orthographic projection of the light converting unit 151 onto the first base substrate 11 is of superposition with the orthographic projection of the corresponding light blocking sub-portion 1411 onto the first base substrate 11. That is, the light blocking sub-portions 1411 and the light converting units 151 are distributed in the same way. Three adjacent light emitting devices 121 (R, G, B) in the light emitting device layer 12 constitute a pixel unit and a plurality of pixel units are respectively arranged as right-eye pixels and left-eye pixels. The right-eye pixels and left-eye pixels of the light emitting device layer 12 cooperate with the grating layer 14 such that only the right-eye pixels, excluding the left-eye pixels, may be visible through the light transmitting portions 142 by the right eye of a viewer and only the left-eye pixels, excluding the right-eye pixels, may be visible through the light transmitting portions 142 by the left eye of the viewer.

In an embodiment, the resolution under the two-dimension display mode is associated with distribution density of the light blocking sub-portions 1411 and in turn, the distribution of the light blocking sub-portions 1411 is associated with distribution of the electroluminescent devices 121.

Figure 4:
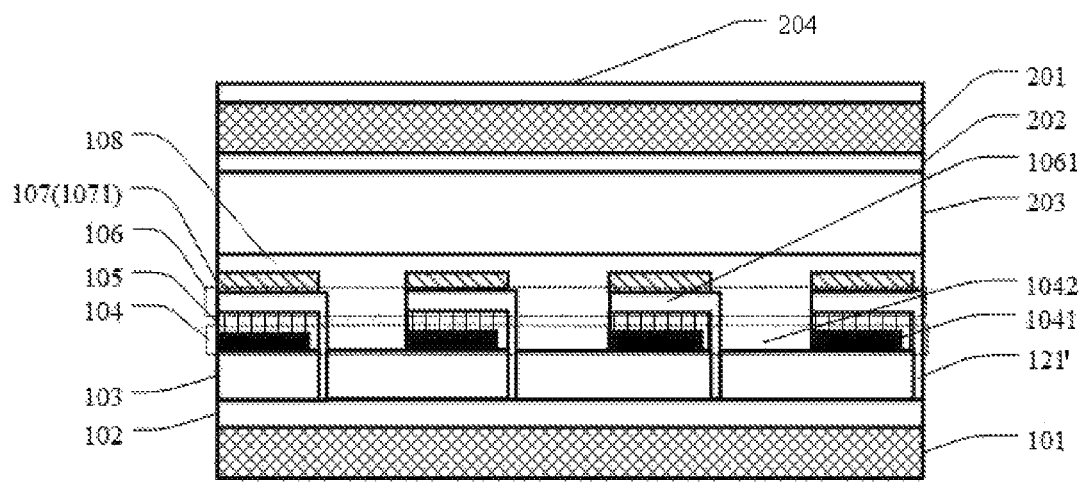
FIG. 4 illustrates a cross sectional view of an exemplary structure of an display panel according to another embodiment of the present disclosure.

Referring to FIG. 4, a schematic view of a display panel according to another embodiment of the present disclosure is illustrated. The display panel in this embodiment is different from that as shown in FIG. 1 in that a second insulating layer 105 and a second electrode layer 106 are further included between the grating layer 104 and the light converting layer 107. The second electrode layer 106 includes a plurality of second sub electrodes 1061. The light converting layer 107 is disposed between the second electrode layer 106 and the first insulating layer 108. The light converting layer 107 includes a plurality of light converting units 1071 and an orthographic projection of each light converting unit 1071 onto the first base substrate is of superposition with an orthographic projection of the corresponding second sub electrode 1061 onto the first base substrate. In FIG. 4, in order to noticeably indicate the through hole 121', the through hole 121' is widened. However, a connection portion that passes through the through hole to be connected with the second sub electrode occupies a very small area. The area of the orthographic projection of the connection portion onto the first base substrate may be negligible relative to the second sub electrode.

In this embodiment, a separate second electrode layer 106 is provided to cooperate with the first electrode layer 202 to drive deflection of the liquid crystal molecules in the liquid crystal layer 203. The plurality of second sub electrodes 1061 in the second electrode layer 106 may be connected with an individual drive circuit. Each of the second sub electrodes 1061 in the second electrode layer 106 may be connected to the drive circuit in the light emitting device layer 102 by passing through the through hole 121' that penetrates the second insulating layer 105, the packaging layer 103 and the light emitting device layer 102, such that the liquid crystal layer 203 and the light emitting device layer 102 are both driven by the drive circuit in the light emitting device layer 102, thereby leading to a more compact structure of the display panel.

In addition, in order to avoid the second electrode layer 106 from contacting the metal of the light blocking portions 1041, the second insulating layer 105 covers all of the light blocking portions 1041. In this instance, a width of the orthographic projection of the second sub electrode layer 1061 onto the first base substrate 101 is slightly greater than a width of the orthographic projection of the light blocking portion 1041 onto the first base substrate 101. At the same time, in order to maintain the reflective two-dimension display effect, the second electrode layer 106 is made of transparent conductive material.

Figure 5:
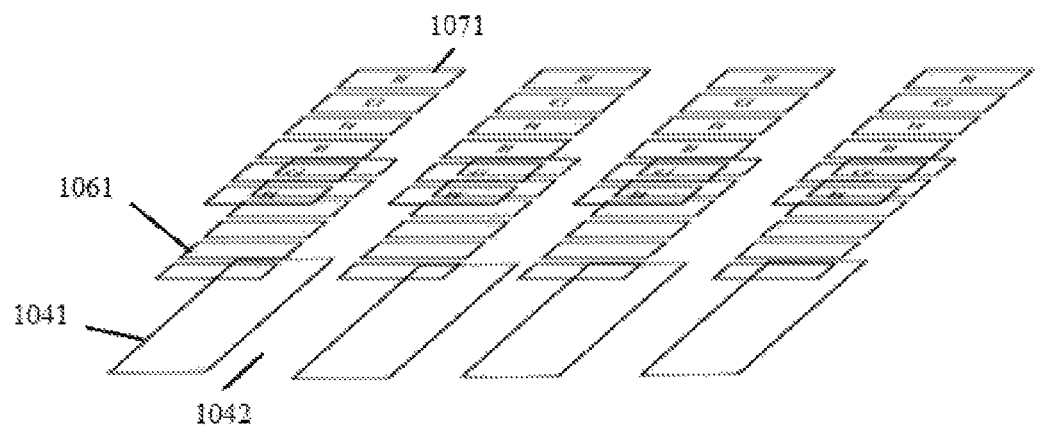
FIG. 5 illustrates a schematic view of a light converting layer, a second electrode layer and a grating layer according to an embodiment of the present disclosure.

Referring to FIG. 5, a schematic view of the light converting layer 107, the second electrode layer 106 and the grating layer 104 according to an embodiment of the present disclosure is illustrated. In this embodiment, the grating layer 104 includes light blocking portions 1041 and a light transmitting portions 1042 arranged alternately, and each of the light blocking portions 1041 are not divided into a plurality of light blocking sub-portions. The second electrode layer 106 on top of each of the light blocking portion 1041 includes a plurality of second sub electrodes 1061. The light converting layer 107 includes a plurality of light converting units 1071. It should be understood that the number of the second sub electrodes 1061 corresponding to each light blocking portion 1041 can be increased to increase resolution of the display panel under the two-dimension display mode.

In at least one embodiment, the second electrode layer 106 is made of a transparent conductive material, thereby preventing the second electrode layer 106 from shielding the light reflected by the light blocking portions 1041. In practice, a packaging layer 103 may be included between the light emitting device layer 102 and the grating layer and through holes 121' pass through the packaging layer 103. The through holes 121' are arranged to keep away from the region where the organic luminescent material is located in the light emitting device layer, reducing bad influence on the packaging layer 103 as possible.

In some embodiments, as shown in FIG. 1 and FIG. 4, the display panel may further include a polarizing sheet 24 (in the embodiment as shown in FIG. 4, the polarizing sheet is denoted by reference numeral 204) located at a side of the second base substrate 21 (in the embodiment as shown in FIG. 4, the second base substrate is denoted by reference numeral 201) facing away from the liquid crystal layer 23 (in the embodiment as shown in FIG. 4, the liquid crystal layer is denoted by reference numeral 203). Specifically, the polarizing sheet 24 can be a linear polarization sheet.

As another aspect, embodiments of the present disclosure provide a display including the display panel according to any of the embodiments of the present disclosure. In one such embodiment, the display may include a light source disposed at a side of the second base substrate facing away from the light emitting device layer 12. The light source may be a dot matrix light source, or may be a light guiding plate, or other type of light source that may be used. The light from the light source may be straight-down incident to the light blocking portions 141, or may be side-incident to the light blocking portions 141 via a light guiding plate.

Figure 6:
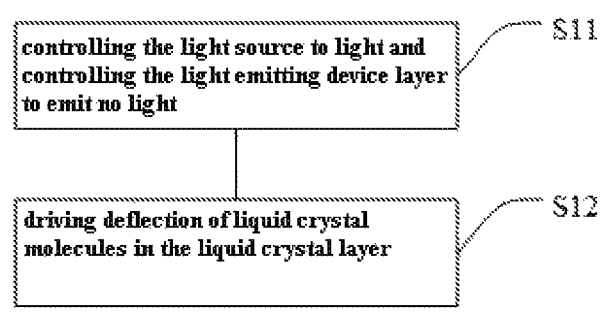
FIG. 6 illustrates a schematic flow chart of a first display mode according to the present disclosure.
Figure 7:
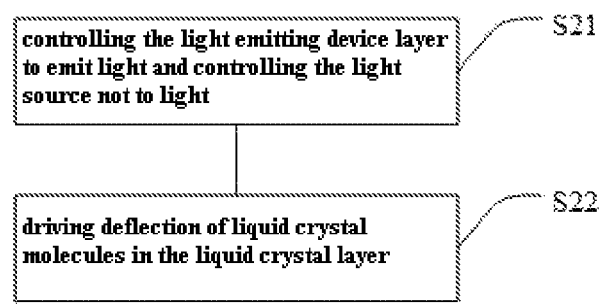
FIG. 7 illustrates a schematic flow chart of a second display mode according to the present disclosure.

As the third aspect, embodiments of the present disclosure provide a displaying method of the display panel, the method including: performing a first display mode and performing a second display mode. Referring to FIG. 6 and FIG. 7, exemplary flow charts of the first display mode and the second display mode are respectively shown.

In an embodiment, the first display mode includes the following steps:

Step S11: controlling the light emitting device layer to emit no light; and

Step S12: driving deflection of liquid crystal molecules in the liquid crystal layer.

The second display mode includes the following steps:

Step S21: controlling the light emitting device layer to emit light; and

Step S22: driving deflection of liquid crystal molecules in the liquid crystal layer.

The first display mode is substantively directed to a two-dimension display mode where only the liquid crystal layer works. Under the first display mode, the light from the light source arranged at the side of the second base substrate facing away from the light emitting device layer passes through the polarizing sheet so as to polarized by the polarizing sheet, and is then reflected by the light blocking portions to enter the liquid crystal layer, or, the light from the light source enters the light converting layer such that the light converting layer emits light and at least a portion of the light from the light converting layer is refracted by the liquid crystal layer and then emits to outside, achieving the two-dimension display.

The second display mode is substantively a three-dimension or stereoscopic display mode. Under this display mode, light emitted by electroluminescent devices of different pixel units passes through the grating layer to form different images at the right eye and the left eye of a viewer respectively, such that the viewer may view a three-dimension image.

The drive circuit in the light emitting device layer may control the drive of the light emitting device layer and the liquid crystal layer respectively, achieving display of the two modes. Herein, the light source may be external light, or may be a specific light source provided in the display panel or display device.

Although the steps of the method according to the present disclosure is illustrated in a particular order in the drawings, it is not intended or hinted to operate the steps according to the particular order necessarily. The steps in the flow chart may be operated in other order. For example, step S12 may be performed before performing step S11; or, step S22 may be performed before performing step S21.

In at least one embodiment, under the second display mode, the drive circuit may control the region of the liquid crystal layer corresponding to the light transmitting portion to transmit light therethrough and the rest of the liquid crystal layer to block light. The display mode is suitable to a situation where the display panel according to the present disclosure is used under intense external light, such as in an outdoor condition. The region of the liquid crystal layer corresponding to the light blocking portions prevents external light reflected by the light blocking portions from affecting display effect due to its non-transmission.

In some embodiments, under the second display mode, the drive circuit may control all regions of the liquid crystal layer to be of light transmission. The display mode is suitable to a situation where the display panel according to the present disclosure is used under weak external light, such as in an indoor condition. Although a portion of the external light is reflected by the light blocking portions and exits outside, the display effect will not be affected.

The above description is merely intended to illustrate some exemplary embodiments of the present disclosure and technical principle used thereof. It is understood the scope of the present disclosure is not limited to the above technical schemes that are obtained by combining the above technical features in particular manners and shall cover other schemes obtained by combining the above technical features or their equivalent features in random manners without departing from the disclosed inventive concept, such as the technical schemes obtained by replacing the above features by the features that are not disclosed in the present disclosure but have similar functions as the disclosed features.

The invention claimed is:

1. A display panel comprising:
   a first base substrate and a second base substrate arranged to be opposite to each other;
   a liquid crystal layer configured between the first base substrate and the second base substrate; and
   a light emitting device layer at a side of the first base substrate facing towards the second base substrate; and
   a grating layer between the light emitting device layer and the liquid crystal layer;
   wherein the grating layer comprises a plurality of light blocking portions and a plurality of light transmitting portions alternatingly arranged therein, the light blocking portions being reflective;
   wherein the display panel further comprises a light converting layer provided on each of the light blocking portions, wherein the light emitting device layer, the grating layer and the light converting layer are arranged in order in a direction from the first base substrate to the second base substrate; and
   wherein a second insulating layer and a second electrode layer are provided between the grating layer and the light converting layer, wherein the second electrode layer comprises a plurality of second sub electrodes, the light converting layer comprises a plurality of light converting units, an orthographic projection of each of the light converting units onto the first base substrate being of superposition with an orthographic projection of a corresponding one of the second sub electrodes onto the first base substrate, and the orthographic projection of each of the light converting units onto the first base substrate is within an orthographic projection of a corresponding one of the light blocking portions on the first base substrate.

2. The display panel according to claim 1, wherein the light blocking portions are made of metal.

3. The display panel according to claim 1, wherein the light emitting device layer further comprises a drive circuit.

4. The display panel according to claim 3, wherein each of the second sub electrodes is electrically connected with the drive circuit via a through hole passing through the second insulating layer and the light emitting device layer.

5. The display panel according to claim 1, further comprising:
   a first electrode layer on a surface of the second base substrate facing towards the first base substrate, the first electrode layer being located between the second base substrate and the liquid crystal layer; and
   a first insulating layer at a side of the first base substrate facing towards the second base substrate, the first insulating layer isolating the liquid crystal layer from the light converting layer and the grating layer on the first base substrate.

6. The display panel according to claim 1, wherein the second electrode layer is made of a transparent conductive material.

7. The display panel according to claim 1, wherein the light converting layer is a quantum dot containing film.

8. The display panel according to claim 1, wherein the light emitting device layer comprises a plurality of light emitting devices arranged in an array.

9. The display panel according to claim 1, further comprising a polarizing sheet located at a side of the second base substrate facing away from the liquid crystal layer.

10. The display panel according to claim 1, further comprising a color filter layer disposed on the light blocking portions, wherein the light emitting device layer, the grating layer and the color filter layer are arranged in order in a direction from the first base substrate to the second base substrate.

11. A display comprising the display panel according to claim 1.

12. The display according to claim 11, further comprising a light source disposed at a side of the second base substrate facing away from the light emitting device layer.

13. A displaying method of the display panel according to claim 1, wherein the method comprises a first display mode and a second display mode; wherein,
   the first display mode comprises steps of:
      controlling the light emitting device layer to emit no light; and
      driving deflection of liquid crystal molecules in the liquid crystal layer; and
   the second display mode comprises steps of:
      controlling the light emitting device layer to emit light; and
      driving deflection of liquid crystal molecules in the liquid crystal layer.

14. The method according to claim 13, wherein the light emitting device layer further comprises a drive circuit, and
   wherein under the second display mode, driving deflection of liquid crystal molecules in the liquid crystal layer comprises: controlling, by the drive circuit, a region of the light transmitting portions corresponding to the liquid crystal layer to transmit light therethrough.

* * * * *